(12) United States Patent
Teramoto et al.

(10) Patent No.: US 11,211,278 B2
(45) Date of Patent: Dec. 28, 2021

(54) SUBSTRATE PROCESSING APPARATUS AND SUBSTRATE PROCESSING METHOD

(71) Applicant: TOKYO ELECTRON LIMITED, Tokyo (JP)

(72) Inventors: Akihiro Teramoto, Kumamoto (JP); Suguru Enokida, Kumamoto (JP); Masashi Tsuchiyama, Kumamoto (JP); Keisuke Sasaki, Kumamoto (JP)

(73) Assignee: TOKYO ELECTRON LIMITED, Tokyo (JP)

(*) Notice: Subject to any disclaimer, the term of this patent is extended or adjusted under 35 U.S.C. 154(b) by 7 days.

(21) Appl. No.: 16/655,330

(22) Filed: Oct. 17, 2019

(65) Prior Publication Data

US 2020/0126823 A1 Apr. 23, 2020

(30) Foreign Application Priority Data

Oct. 18, 2018 (JP) .............................. JP2018-196430

(51) Int. Cl.
*H01L 21/677* (2006.01)
(52) U.S. Cl.
CPC .... *H01L 21/6773* (2013.01); *H01L 21/67733* (2013.01); *H01L 21/67769* (2013.01); *H01L 21/67781* (2013.01)
(58) Field of Classification Search
CPC ............... H01L 21/67733; H01L 21/6773
See application file for complete search history.

(56) References Cited

U.S. PATENT DOCUMENTS

2010/0202861 A1* 8/2010 Sawado ............ H01L 21/67724
414/222.02
2010/0290872 A1* 11/2010 Bonora ............... H01L 21/6773
414/225.01

FOREIGN PATENT DOCUMENTS

JP 2009-10287 A 1/2009

* cited by examiner

*Primary Examiner* — Kaitlin S Joerger
*Assistant Examiner* — Willie Berry, Jr.
(74) *Attorney, Agent, or Firm* — Nath, Goldberg & Meyer; Jerald L. Meyer; Tanya E. Harkins

(57) ABSTRACT

There is provided a substrate processing apparatus for processing a substrate, including: a storage part provided on an uppermost portion of the substrate processing apparatus and on which a substrate accommodation container for accommodating the substrate is placed; and a first transfer device configured to directly or indirectly deliver the substrate accommodation container between the storage part and a loading/unloading part, wherein the loading/unloading part is configured to place the substrate accommodation container thereon in the substrate processing apparatus and to load and unload the substrate into and from a processing part of the substrate processing apparatus, and the first transfer device is configured to deliver the substrate accommodation container with respect to an overhead hoist transport that moves above the substrate processing apparatus.

16 Claims, 11 Drawing Sheets

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2018-196430, filed on Oct. 18, 2018, the entire contents of which are incorporated herein by reference.

TECHNICAL FIELD

The present disclosure relates to a substrate processing apparatus and a substrate processing method.

BACKGROUND

Patent Document 1 discloses a substrate processing system having a configuration in which a cassette standby block, in which a plurality of cassettes to be loaded into the substrate processing system are put on standby, is provided adjacent to a loading/unloading block of the substrate processing system.

PRIOR ART DOCUMENT

Patent Documents

Japanese Laid-Open Patent Publication No. 2009-10287

SUMMARY

According to an embodiment of the present disclosure, there is provided a substrate processing apparatus for processing a substrate, including: a storage part provided on an uppermost portion of the substrate processing apparatus and on which a substrate accommodation container for accommodating the substrate is placed; and a first transfer device configured to directly or indirectly deliver the substrate accommodation container between the storage part and a loading/unloading part, wherein the loading/unloading part is configured to place the substrate accommodation container thereon in the substrate processing apparatus and to load and unload the substrate into and from a processing part of the substrate processing apparatus, wherein the first transfer device is configured to deliver the substrate accommodation container with respect to an overhead hoist transport that moves above the substrate processing apparatus.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
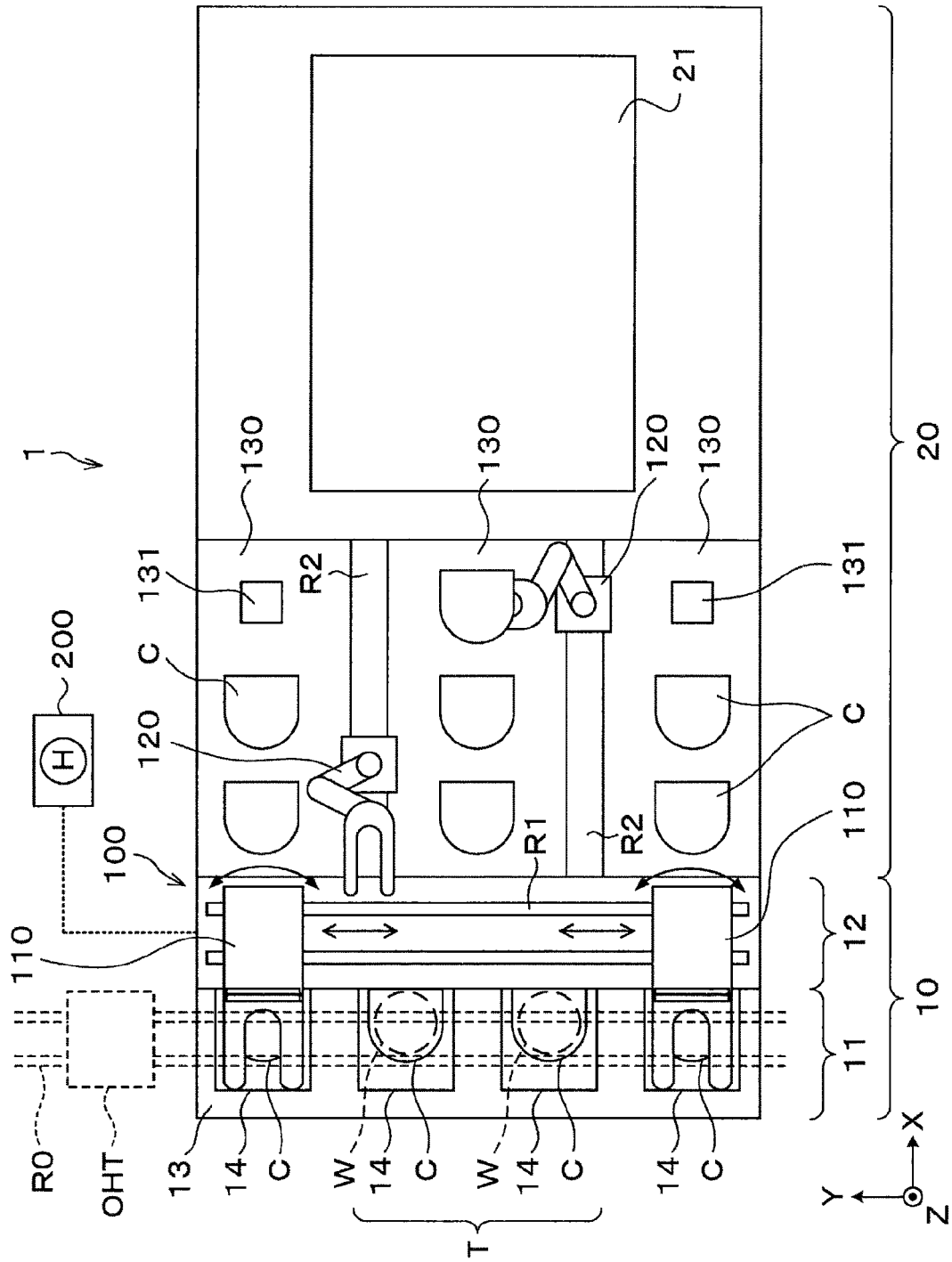
FIG. 1 is a plan view schematically illustrating the outline of the configuration of a wafer processing apparatus.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, the configuration of a conventional substrate processing system disclosed in Patent Document 1 will be described. Herein, the substrate is referred to as a "wafer". The processing system disclosed in Patent Document 1 includes a loading/unloading block, and a cassette standby block as a stocker provided adjacent to the loading/unloading block, which accommodates a plurality of cassettes to be loaded into/unloaded from the loading/unloading block. The cassette standby block is covered with a casing for performing atmosphere control. A cassette loading/unloading port is formed in a ceiling face of the casing. In addition, a rail for an inter-apparatus cassette transfer device is disposed above the cassette standby block. The inter-apparatus cassette transfer device is configured to load and unload a cassette into and from the cassette standby block from above through the loading/unloading port.

As described above, the cassette standby block generally called FOUP exchanger (FEX) is an apparatus for temporarily stocking a plurality of cassettes (FOUPs) as substrate accommodation containers, each of which accommodates a plurality of (e.g., 25) wafers to be processed by the processing system. A plurality of (e.g., 10 or more) cassettes are stocked in the FEX. As described above, since the FEX has a function of temporarily stocking the cassettes to be loaded into/unloaded from the processing system, the FEX is generally located adjacent to the loading/unloading block of the processing system, for example, at the front side of the loading/unloading block of the substrate processing system in Patent Document 1.

However, in the case where the FEX stocks a plurality of cassettes, the scale of the FEX naturally increases. In the case where the FEX is provided adjacent to the processing system as described above, footprint occupied by the FEX is increased, which increases footprint of the entire processing system.

Accordingly, an aspect of the technique according to the present disclosure reduces the footprint occupied by the FEX in the substrate processing apparatus by providing the FEX above the substrate processing apparatus.

Hereinafter, the configuration of a wafer processing apparatus as the substrate processing apparatus according to the present embodiment will be described with reference to the drawings. In this specification, elements having substantially the same functional configurations will be denoted by the same reference numerals and redundant explanations will be omitted.

<Wafer Processing Apparatus>

Figure 2:
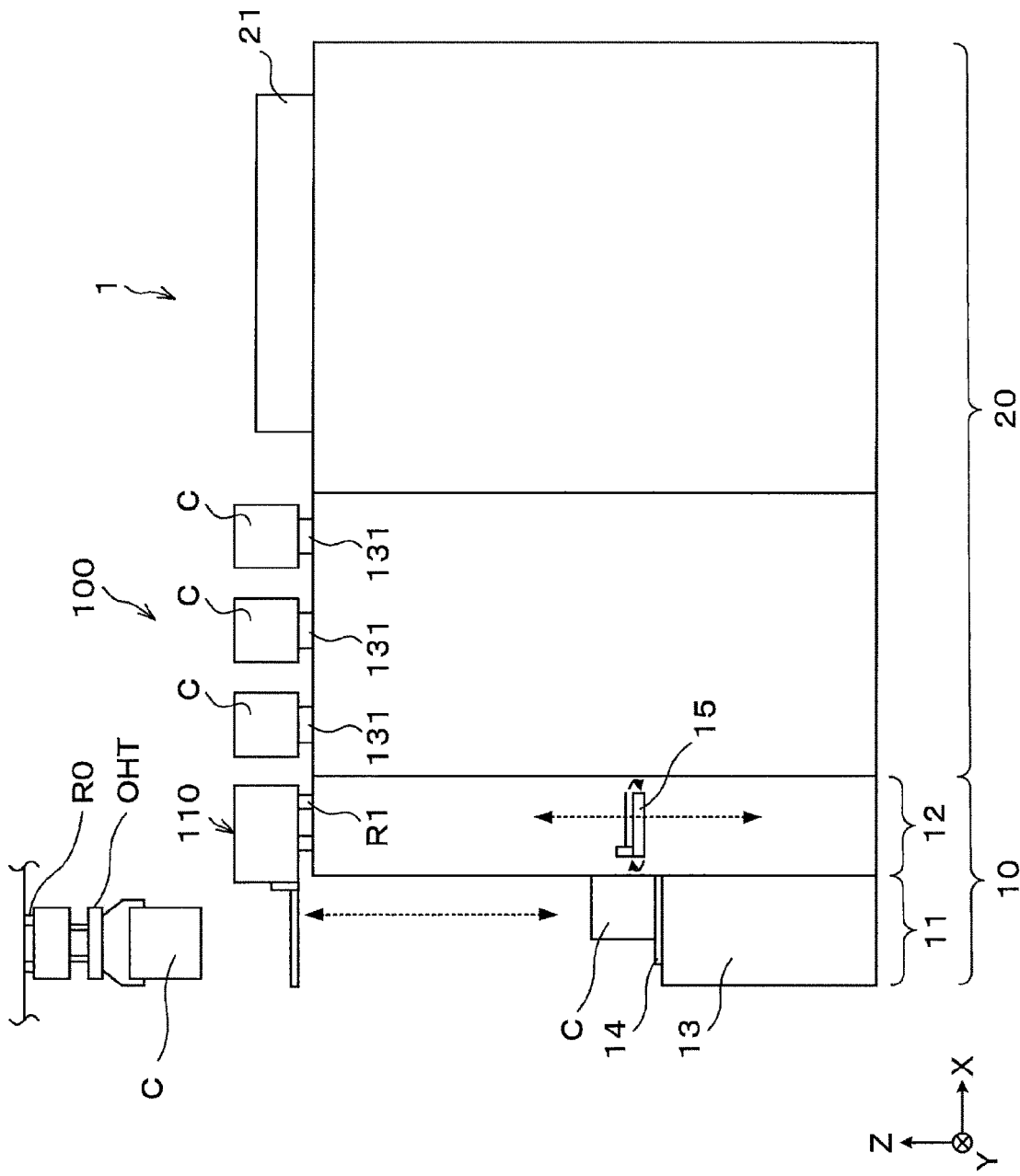
FIG. 2 is a side view schematically illustrating the outline of the configuration of the wafer processing apparatus.
Figure 3:
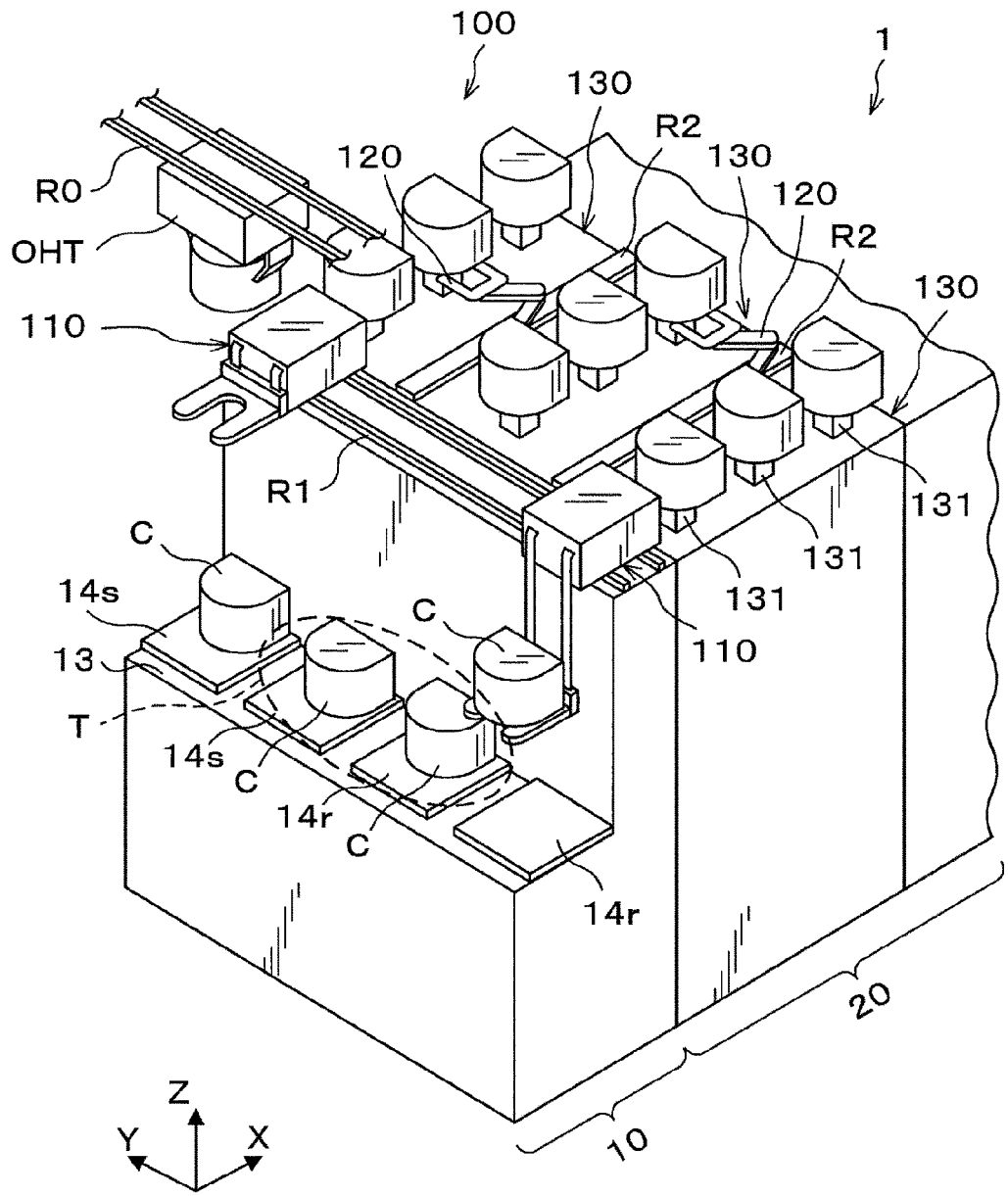
FIG. 3 is a perspective view schematically illustrating outline of the configuration of the wafer processing apparatus.

First, the configuration of the wafer processing apparatus according to the present embodiment will be described. FIGS. 1 to 3 are a plan view, a side view, and a perspective view schematically illustrating the outline of the configuration of a wafer processing apparatus 1, respectively.

As illustrated in FIGS. 1 and 2, the wafer processing apparatus 1 has a configuration in which a loading/unloading station 10 as a loading/unloading part for a substrate accommodation container (hereinafter referred to as a "cassette C") that accommodates a plurality of wafers W, and a processing station 20 as a processing part including a plurality of various processing apparatuses (not illustrated) for performing predetermined processes on the wafers W, are integrally connected together.

Further, the wafer processing apparatus 1 includes a FEX (foup exchanger) 100 as a storage part that temporarily holds and stocks a plurality of cassettes C that are loaded into/unloaded from the loading/unloading station 10. The FEX 100 is provided on the uppermost portion of the wafer processing apparatus 1, specifically, on the top surface of the ceiling of the wafer processing apparatus 1.

The loading/unloading station 10 includes a loading/unloading block 11 and a transfer block 12. The loading/unloading block 11 is provided at a position lower than the transfer block 12 and the processing station 20 by one stage. A cassette stage 13 is provided on an upper surface of the loading/unloading block 11. The cassette stage 13 is provided with a cassette placement plate 14 on which the cassette C is placed. The cassette placement plate 14 is used when loading/unloading the cassette C with respect to the outside of the FEX 100 or the wafer processing apparatus 1, namely an overhead hoist transport (OHT) to be described later.

A unprocessed cassette C1 in which a plurality of unprocessed wafers W can be accommodated, a processed cassette C3 in which a plurality of processed wafers W can be accommodated, an empty cassette C2 from which the wafers W are unloaded, are loaded into or unloaded from the loading/unloading block 11. In the present embodiment, the cassette stage 13 may include four cassette placement plates 14 on which the cassettes C are placed in a line along the Y-axis direction, respectively.

In addition, the cassette stage 13 includes a sender area (a loading-dedicated section) and a receiver area (unloading-dedicated section). The unprocessed cassette C1 are placed in the sender area so as to load the wafers W into the wafer processing apparatus 1. The processed cassette C3 are placed in the receiver area so as to unload the wafers W from the interior of the wafer processing apparatus 1. In the following description, the cassette placement plate 14 located in the sender area will be sometimes referred to as a cassette placement plate 14s, and the cassette placement plate 14 located in the receiver area will be sometimes referred to as a cassette placement plate 14r.

In the following description, for the sake of convenience in illustration, as illustrated in FIG. 3, two cassette placement plates 14s and two cassette placement plates 14r are shown to be arranged in the Y-axis direction. However, among the four cassette placement plates 14, particularly, the two cassette placement plates 14 located in the center may perform the roles of both a sender and a receiver. That is to say, among the four cassette placement plates 14, three cassette placement plates located at the positive side in the Y-axis direction are included in the sender area, three cassette placement plates located at the negative side in the Y-axis direction are included in the receiver area, and the two cassette placement plates 14 located in the center are included in an overlapping area T of the sender area and the receiver area.

A wafer transfer device 15 is provided in the transfer block 12 to be movable along a transfer path (not illustrated) extending in the Y-axis direction in FIG. 1. The wafer transfer device 15 is also movable in the vertical direction and rotatable around a vertical axis (θ direction). The wafer transfer device 15 is capable of transferring the wafer W between the cassette C on the cassette placement plate 14 and a wafer delivery device (not illustrated) provided inside the processing station 20.

For example, an OHT that is movable along a transfer path R0 extending in the Y-axis direction is provided above the loading/unloading block 11 of the loading/unloading station 10. The OHT is configured to transfer the cassettes C to and from another wafer processing apparatus provided outside the wafer processing apparatus 1, and accesses first transfer parts 110 as transfer devices provided in the FEX 100 (to be described later) from above so as to deliver the cassettes C. As will be described later, the OHT is configured to directly deliver the cassettes C to the cassette placement plates 14 of the loading/unloading station 10.

The processing station 20 is provided with a plurality of various processing apparatuses (not illustrated) for performing predetermined processes on the wafers W. The types and configurations of these processing apparatuses are not particularly limited. For example, the processing station 20 may take any configuration such as a coating/developing system, a plasma processing system and the like. The processing station 20 has the capability of performing the predetermined processes on 100 or more wafers W (e.g., 150 wafers W) at a time.

In addition, a fan filter unit (FFN) 21 may be provided above the processing station 20 to form a clean air flow inside the processing station 20. The FFU 21 may be omitted depending on the type and configuration of the processing station 20.

As illustrated in FIGS. 2 and 3, the FEX 100 is provided on the uppermost portion of the wafer processing apparatus 1, for example, the upper surface of the ceiling portion that is the uppermost portion of the wafer processing apparatus 1. The FEX 100 includes the first transfer parts 110 as transfer devices, second transfer parts 120 as another transfer devices, and cassette holders 130 as an accommodation container holder. The FEX 100 functions as a stocker for temporarily retracting and holding the cassettes C to be loaded into from the wafer processing apparatus 1 or unloaded from the wafer processing apparatus 1, and are configured to deliver the cassettes C among the OHT, the cassette placement plates 14 of the loading/unloading station 10, and the cassette holders 130.

The first transfer parts 110 are provided on the uppermost portion of the wafer processing apparatus 1, specifically, the uppermost portion of the transfer block 12 at the negative side in the X-axis direction, and is configured to be movable on a transfer path R1 provided to extend in the Y-axis direction. Each of the first transfer parts 110 is configured to be rotatable about a vertical axis by a rotation mechanism (not illustrated). With this configuration, the first transfer parts 110 are capable of delivering the cassettes C received from the OHT between the cassette placement plates 14, the second transfer parts 120 (to be described later) and cassette holding tables 131 located near the first transfer part 110. A detailed configuration of the first transfer part 110 will be described later.

In the present embodiment, for example, two first transfer parts 110 are provided, and are arranged on the same transfer path R1. In such a case, each of the two first transfer parts 110 is movable along the transfer path R1.

Each of the two first transfer parts 110 is configured to be accessible to either the sender area or the receiver area. That is to say the first transfer part 110 provided at the side of the sender area is configured to deliver the cassettes C to and from the three cassette placement plates 14s located in the sender area including the overlapping area T. Meanwhile, the first transfer part 110 provided at the side of the receiver area is configured to deliver the cassettes C to and from the three cassette placement plates 14r located in the receiver area including the overlapping area T.

The second transfer parts 120 are configured to be respectively movable on two transfer paths R2 provided to extend parallel to the X-axis direction at the positive side in the X-axis direction of the transfer paths R2 in the uppermost portion of the wafer processing apparatus 1. The second transfer parts 120 are configured to transfer the cassettes C received from the first transfer parts 110, to and from the cassette holders 130 to be described later.

Figure 4:
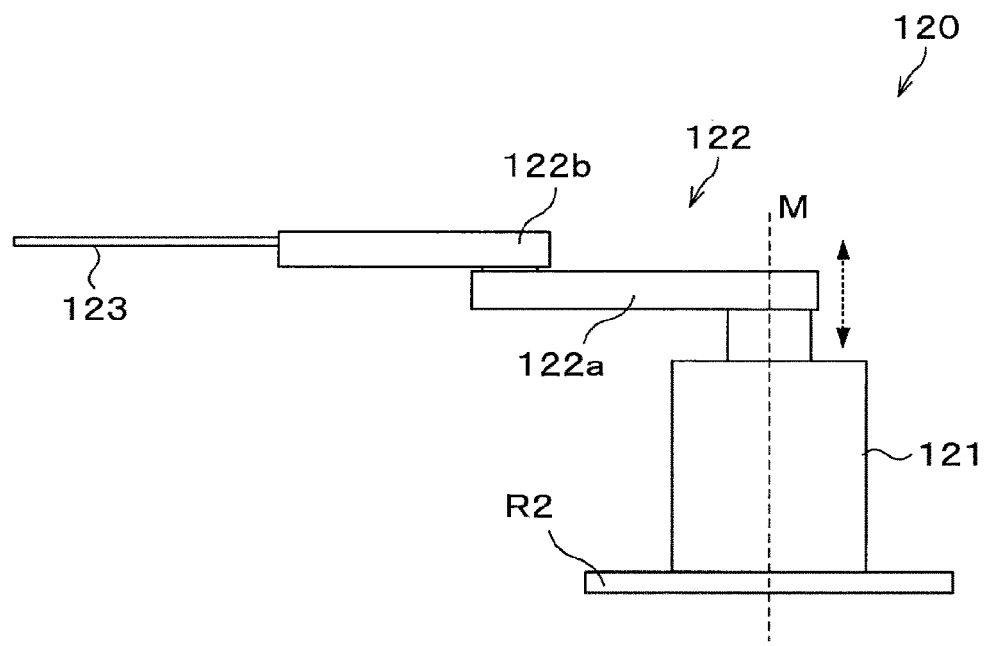
FIG. 4 is a side view schematically illustrating the outline of the configuration of a second transfer part.
Figure 5:
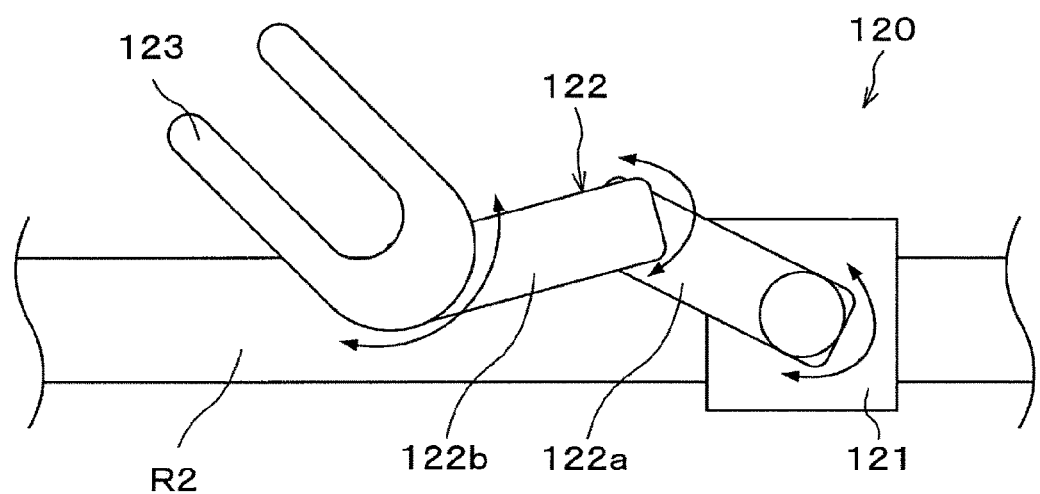
FIG. 5 is a plan view schematically illustrating the outline of the configuration of the second transfer part.

FIGS. 4 and 5 are a side view and a plan view, respectively, schematically illustrating the outline of the configuration of the second transfer part 120. As illustrated in FIGS. 4 and 5, each of the second transfer parts 120 has an articulated arm structure composed of a base portion 121 that travels on the transfer path R2, an articulated arm 122, and a transfer arm 123.

The articulated arm 122 is configured to be swingable and extendible, and includes a first joint arm 122a and a second joint arm 122b. A base end of the first joint arm 122a is connected to the base portion 121 so as to be rotatable around a vertical axis thereof. The second joint arm 122b is connected to a leading end of the first joint arm 122a so as to be rotatable about a vertical axis thereof. The transfer arm 123 is connected to a leading end of the second joint arm 122b so as to be rotatable about a vertical axis thereof.

In addition, the second transfer part 120 may include a lifting mechanism (not illustrated) provided inside the base portion 121 to adjust a vertical height of the transfer arm 123. The lifting mechanism is configured to move upward and downward the articulated arm 122 and the transfer arm 123 along a lifting axis M. By moving upward and downward the transfer arm 123 via the articulated arm 122, the second transfer part 120 is capable of delivering the cassette C to and from the first transfer part 110.

In the present embodiment the two second transfer parts 120 are provided as described above, and are provided on the two transfer paths R2 arranged in parallel in the Y-axis direction to correspond to the side of the sender area and the side of the receiver area, respectively. Each of the two second transfer parts 120 is movable in the X-axis direction, and is capable of accessing the cassette holder 130 disposed adjacent to the respective transfer path R2 so as to deliver the cassette C with respect to the first transfer part 110.

The second transfer parts 120 respectively provided at the side of the sender area and the side of the receiver area, correspond to the first transfer parts 110 respectively provided on the side of the sender area and the side of the receiver area, respectively, so as to deliver the cassettes C with respect to the respective first transfer parts 110. That is to say, one second transfer part 120 is capable of delivering the cassette C with respect to one specific first transfer part 110.

As illustrated in FIG. 3, a total of three rows of cassette holders 130 are provided adjacent to the two transfer paths R2 in the Y-axis direction. Each of the cassette holders 130 includes a plurality of (for example, three) cassette holding tables 131 for temporarily holding the cassettes C, which are arranged in the X-axis direction in the present embodiment. Accordingly, a total of nine cassette holding tables 131 are provided in the FEX 100 as a storage part. The cassettes C are placed on respective cassette holding tables 131 by the second transfer part 120. Examples of the cassettes C held in the cassette holders 130 may include the unprocessed cassette C1, the empty cassette C2, the processed cassette C3, and the like.

The cassette holding table 131 may be configured to be rotatable about a vertical axis by a rotation mechanism (not mechanism). With this configuration, when the cassette C is unloaded from the cassette holder 130 by the second transfer part 120, the orientation of the cassette C may be appropriately adjusted. That is to say, it is possible to deliver the cassette C to the loading/unloading station 10 in an appropriate orientation.

The wafer processing apparatus 1 described above is provided with a controller 200. The controller 200 is, for example, a computer, and has a program storage part (not illustrated). The program storage part stores a program for controlling the processing of the wafers W in the wafer processing apparatus 1. In addition, the program storage part stores various programs for controlling operations of other transfer devices and various drive system apparatuses, including the above-described various apparatuses, the first transfer parts 110, and the second transfer parts 120. Accordingly, in the present embodiment, the controller and other controllers are implemented as the single controller 200. The program storage part of the controller 200 also stores a program for implementing another wafer processing in the wafer processing apparatus 1. In addition, the above programs may be recorded in a non-transitory computer-readable storage medium H, and may be installed on the controller 200 from the storage medium H.

<First Transfer Part>

Next, a detailed configuration of the first transfer part 110 will be described.

Figure 6:
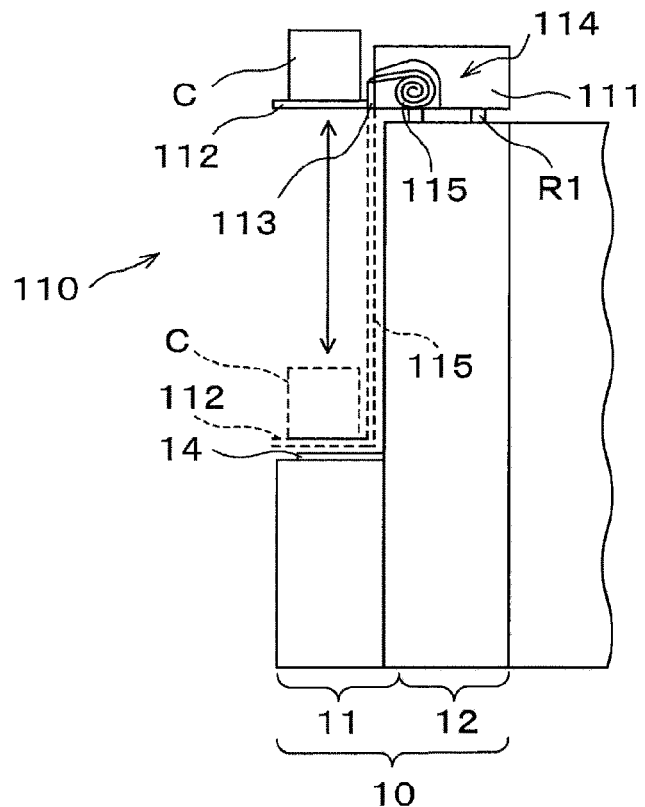
FIG. 6 is a side view schematically illustrating the outline of the configuration of a first transfer part according to an embodiment.
Figure 7:
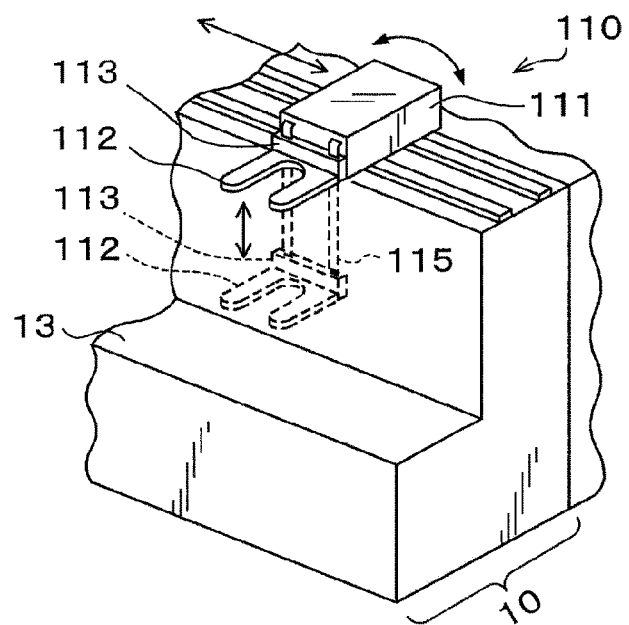
FIG. 7 is a perspective view schematically illustrating the outline of the configuration of the first transfer part according to an embodiment.

FIGS. 6 and 7 are a side view and a perspective view, respectively, schematically illustrating the outline of the configuration of the first transfer part 110. As illustrated in FIGS. 6 and 7, the first transfer part 110 includes a main body 111 configured to travel on the transfer path R1. The main body 111 includes an arm 112 that holds the cassette C on an upper surface thereof. The arm 112 is provided integrally with an arm holder 113. In addition, the arm holder 113 is connected to a winding member 115 provided in a lifting mechanism 114 that is provided inside the main body 111.

The arm 112 protrudes toward the negative side in the X-axis direction with respect to the transfer path R1 in a normal state. That is to say, the arm 112 protrudes upward of the cassette placement plate 14 of the loading/unloading station 10 and downward of the OHT. With this configuration, the first transfer part 110 is configured to be capable of directly delivering the cassette C with respect to the OHT accessed from above.

The arm holder 113 is connected to the winding member 115 of the lifting mechanism 114 as described above. The winding member 115 is configured to be capable of being wound by the operation of a driving part (not illustrated). For example, by operating the driving part in a direction of winding downward the winding member 115 from the main body 111, the arm holder 113 connected to one end of the winding member 115 is moved downward, namely toward the cassette placement plate 14. Meanwhile, for example, by driving the driving part in a direction of winding upward the winding member 115 to the main body 111, the arm holder 113 connected to the one end of the winding member 115 is moved upward, namely toward the main body 111. Accordingly, it is possible to move upward and downward the arm 112 connected to the arm holder 113 and the cassette C placed on the arm 112 between the cassette placement plate 14 of the loading/unloading station 10 and the uppermost portion of the wafer processing apparatus 1.

In addition, the main body 111 is provided with a rotation mechanism (not illustrated), and is configured to be rotatable around a vertical axis in the state in which the arm 112 is moved to the side of the main body 111. This makes it possible to move the arm 112 toward the positive side in the X-axis direction, namely the side of the second transfer part 120, thus delivering the cassette C with respect to the second transfer part 120.

<Cassette Transfer Operation>

The wafer processing apparatus 1 according to the present embodiment is configured as described above. Next, a method of loading/unloading the cassette C using the wafer processing apparatus 1 will be described with reference to the drawings.

Figure 8:
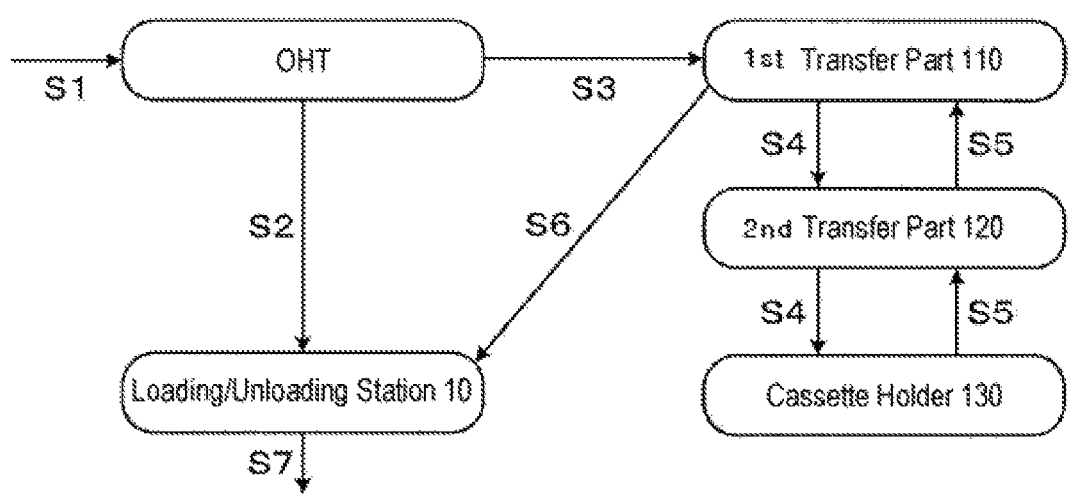
FIG. 8 is a flowchart schematically illustrating a transfer flow of an unprocessed cassette.
Figure 9:
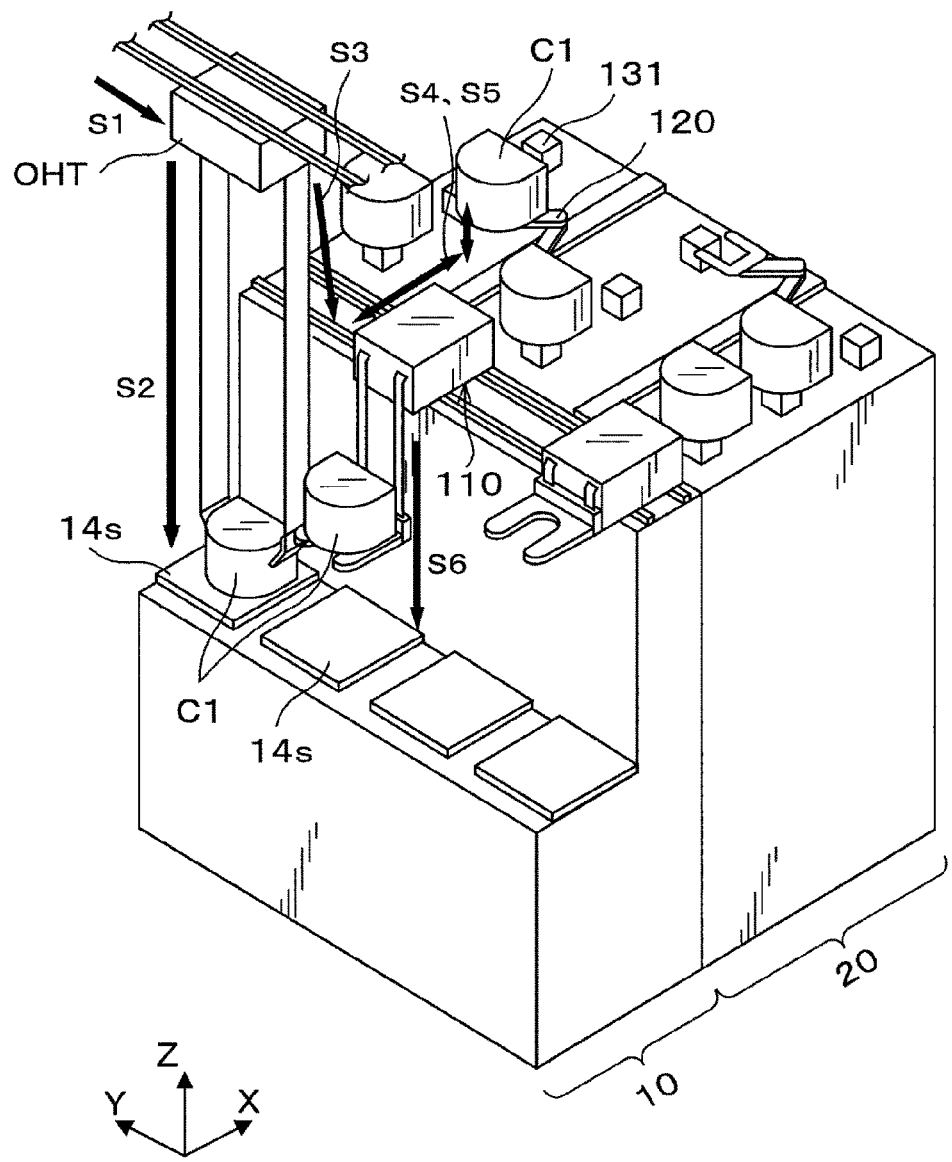
FIG. 9 is a perspective view schematically illustrating the outline of a transfer flow of an unprocessed cassette.

FIGS. 8 and 9 are a flowchart illustrating a flow of the unprocessed cassette C1 when loading the unprocessed cassette C1, and a perspective view of the wafer processing apparatus 1 schematically illustrating main operations in the transfer of the unprocessed cassette C1, respectively. The unprocessed cassette C1 accommodate a plurality of unprocessed wafers W. By transferring the unprocessed cassette C1 to the loading/unloading station 10, the unprocessed wafers W are loaded into the processing station 20 of the wafer processing apparatus 1 so that the predetermined wafer processing is performed on the unprocessed wafers W.

First, the OHT holding the unprocessed cassette C1 moves above the loading/unloading station 10 of the wafer processing apparatus 1 (step S1 in FIGS. 8 and 9). Subsequently, a cassette placement state of the cassette placement plate 14s in the sender area of the cassette stage 13 is checked. When the cassette placement plate 14s is empty, namely when another unprocessed cassette C1 is not mounted on the cassette placement plate 14s, the unprocessed cassette C1 is directly delivered from the OHT to the empty cassette placement plate 14s (step S2 in FIGS. 8 and 9). At this time, when the first transfer part 110 is on a movement track from the OHT to the cassette placement plate 14s (on a delivery path), the first transfer part 110 is moved along the transfer path R1 in the Y-axis direction and is retreated from the movement track so as not to obstruct the loading of the unprocessed cassette C1.

Meanwhile, for example, when there is no empty cassette placement plate 14s, namely when another unprocessed cassette C1 is already placed on the cassette placement plate 14s, the unprocessed cassette C1 is temporarily stocked in the cassette holder 130. At this time, first, the unprocessed cassette C1 is delivered from the OHT to the arm 112 of the first transfer part 110 (step S3 in FIGS. 8 and 9), and subsequently, the first transfer part 110 delivers the unprocessed cassette C1 to the second transfer part 120. Thereafter, the second transfer part 120 that has received the unprocessed cassette C1 places the unprocessed cassette C1 on the cassette holding table 131 of the cassette holder 130 in the FEX 100 (step S4 in FIGS. 8 and 9).

Thereafter, when the other unprocessed cassette C1 on the cassette placement plate 14s is moved so that the cassette placement plate 14s becomes empty, a transfer request for the unprocessed cassette C1 is issued from the respective cassette placement plate 14s to the cassette holder 130 and the second transfer part 120. The second transfer part 120 that received the transfer request for the unprocessed cassette C1 picks up the unprocessed cassette C1 that is temporarily held on the cassette holding table 131 and delivers the same to the first transfer part 110 (step S5 in FIGS. 8 and 9). Then, the unprocessed cassette C1 delivered to the first transfer part 110 is transferred onto the cassette placement plate 14s of the loading/unloading block 11 by the first transfer part 110 (step S6 in FIGS. 8 and 9). Thereafter, the unprocessed wafers W are picked up from the unprocessed cassette C1 by the wafer transfer device 15 of the transfer block 12, and are transferred to the processing station 20 of the wafer processing apparatus 1 (step S7 in FIG. 8).

Figure 10:
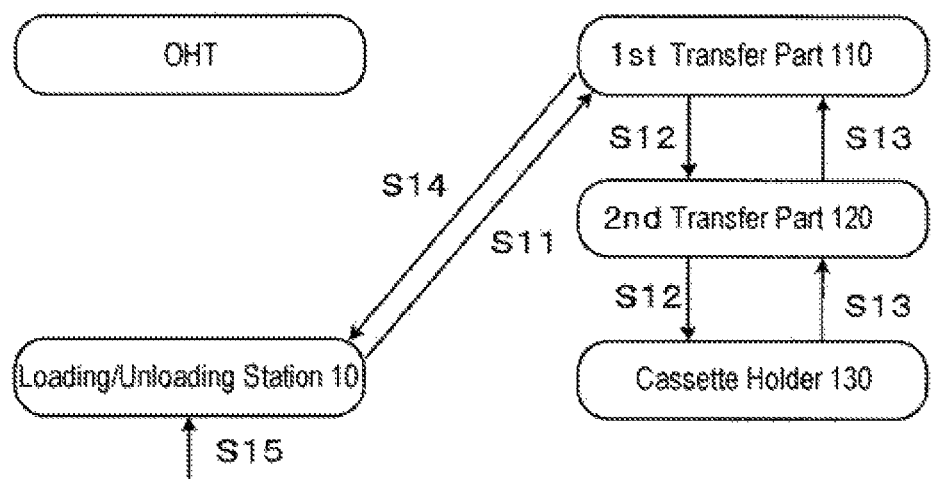
FIG. 10 is a flowchart illustrating the outline of a transfer flow of an empty cassette.
Figure 11:
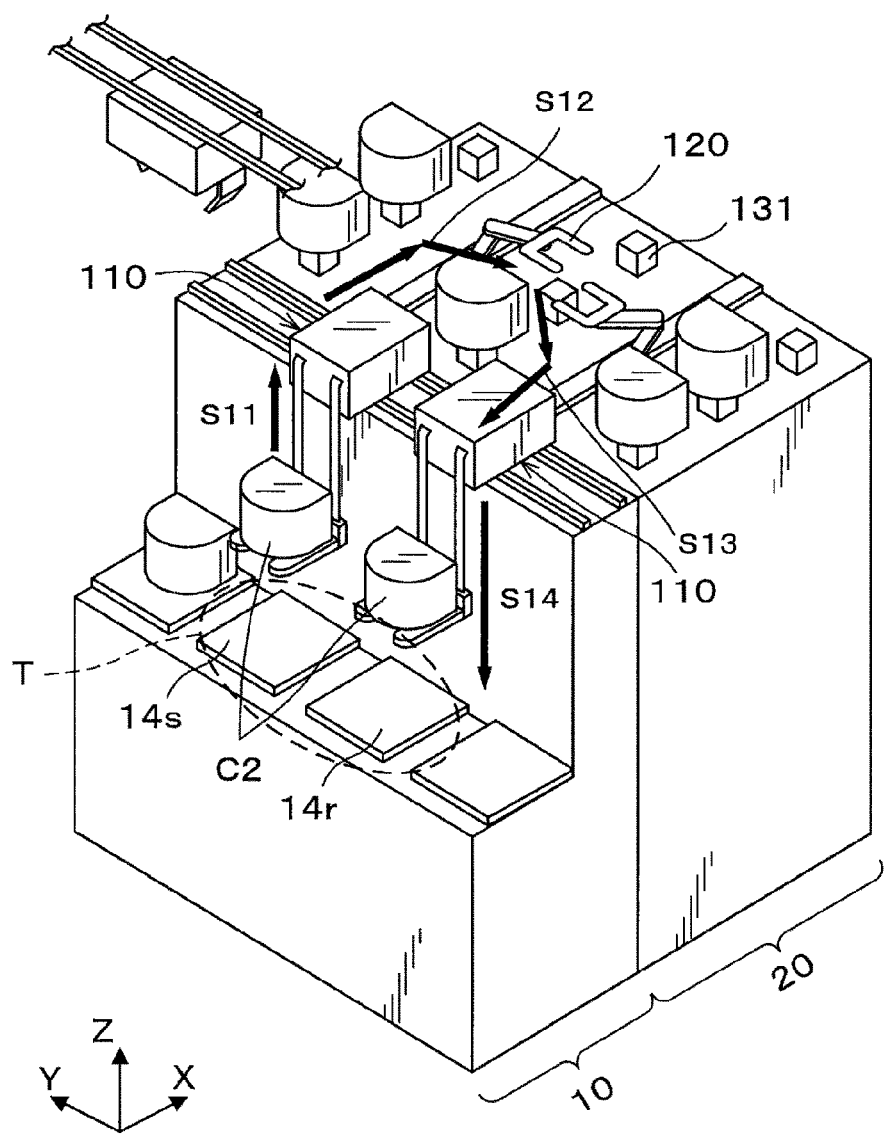
FIG. 11 is a perspective view schematically illustrating the outline of a transfer flow of an empty cassette.

FIG. 10 and FIG. 11 are a flowchart illustrating a flow of transferring the empty cassette C2 which becomes empty in step S7 and a perspective view of the wafer processing apparatus 1 schematically illustrating main operations in transferring the empty cassette C2, respectively.

The empty cassette C2 emptied by the pick-up of the wafers W to the transfer block 12 waits in the cassette holder 130 until the processing of the plurality of wafers W that have been accommodated in the empty cassette C2 is terminated. That is to say, first, the empty cassette C2 emptied in step S7 is moved up to the uppermost portion of the wafer processing apparatus 1 by the first transfer part 110 (step S11 in FIG. 10). Thereafter, the empty cassette C2 is placed on the cassette holding table 131 of the cassette holder 130 by the second transfer part 120 (step S12 in FIG. 10).

As described above, the FEX 100 is configured to temporarily stock the empty cassette C2 in the cassette holder 130 after the wafers W are loaded into the wafer processing apparatus 1. This makes it possible to efficiently transfer the wafers W to the wafer processing apparatus 1 having the capacity to process 150 wafers, as described above. That is to say, since the loading/unloading station 10 has only four cassette placement plates 14 on each of the cassette C accommodating 25 wafers W, only 100 wafers W in total are loaded into the wafer processing apparatus 1. However, by stocking the empty cassette C2 in the cassette holder 130, it is possible to place a new unprocessed cassette C1 on a cassette placement plate 14s so as to sequentially load the wafers W into the wafer processing apparatus 1. Thus, it is possible for the wafer processing apparatus 1 to appropriately exhibit the maximum processing capacity.

When the processing of the plurality of wafers W having been accommodated in the empty cassette C2 is terminated, a transfer request for the empty cassette C2 is sent to the cassette holder 130 and the second transfer part 120 from the side of the cassette placement plate 14r. The second transfer part 120 that has received the transfer request for the empty cassette C2 picks up the empty cassette C2 that is temporarily held on the cassette holding table 131 and delivers the same to the first transfer part 110 (step S13 in FIG. 10). The empty cassette C2 transferred at this time is the same as the unprocessed cassette C1 that originally stored the plurality of wafers W which have been subjected to the wafer processing. Combinations of IDs assigned to the wafers W and ID assigned to the respective cassette C are controlled to remain unchanged. Then, the empty cassette C2 placed on the first transfer part 110 is delivered onto the cassette placement plate 14r in the receiver area of the cassette stage 13 by the first transfer part 110 (step S14 of FIG. 10). Thereafter, the processed wafers W are returned from the interior of the wafer processing apparatus 1 to the empty cassette C2 via the transfer block 12 (step S15 in FIG. 10).

The transfer of the empty cassette C2 to the cassette placement plate 14r by the first transfer part 110 in step S14 is preferentially performed with respect to the cassette placement plate 14r located at the side of the cassette placement plate 14s. Specifically, the first transfer part 110 that transfers the empty cassette C2 preferentially transfers the empty cassette C2 to the cassette placement plate 14r located in the overlapping area T in the receiver area.

Figure 12:
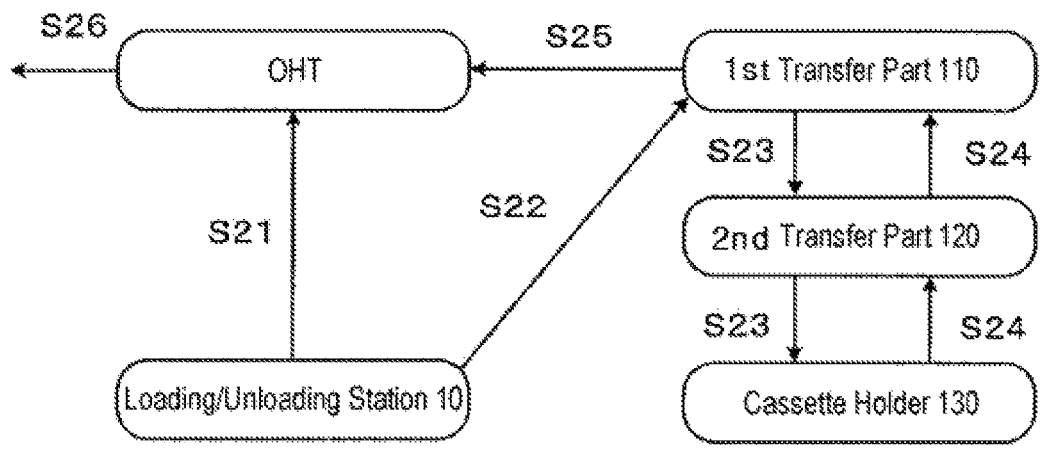
FIG. 12 is a flowchart illustrating the outline of a transfer flow of a processed cassette.
Figure 13:
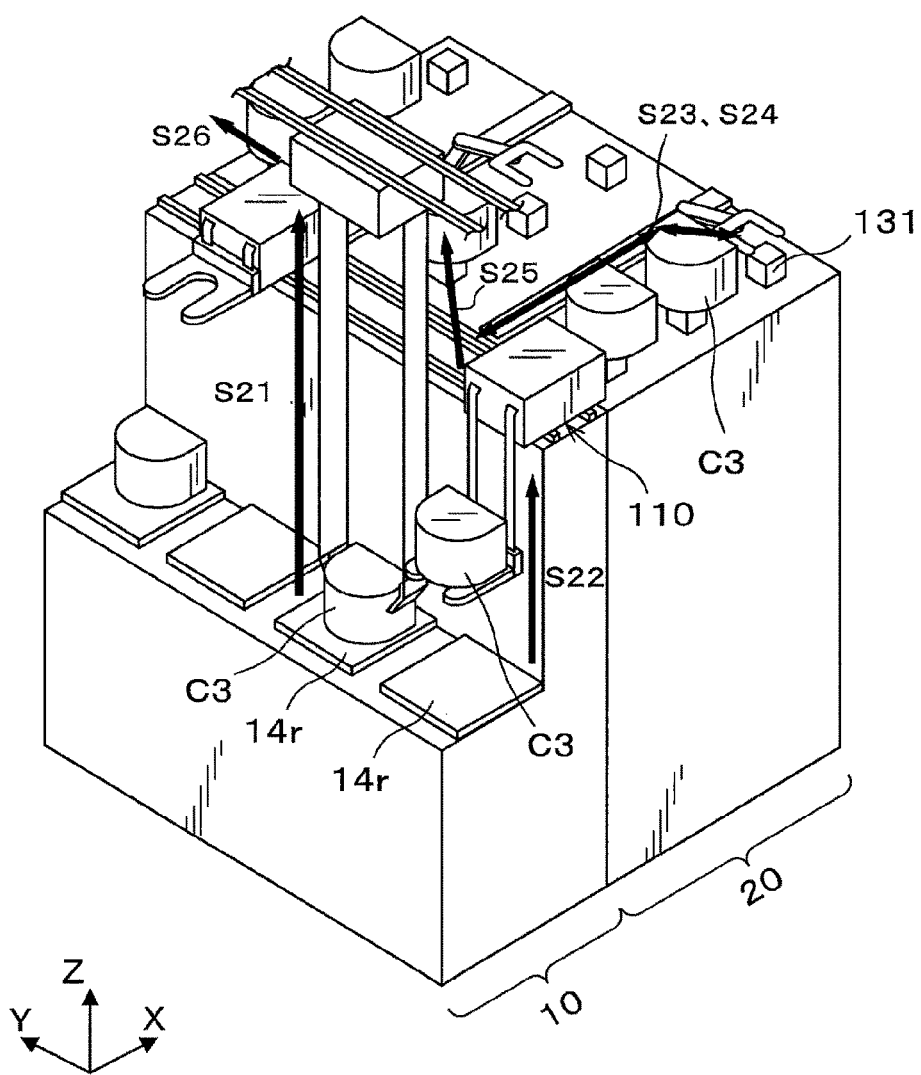
FIG. 13 is a perspective view schematically illustrating the outline of a transfer flow of a processed cassette.

FIGS. 12 and 13 are a flowchart illustrating a flow of unloading the processed cassette C3 to which the processed wafers W have been returned in step S15, and a perspective view of the wafer processing apparatus 1 schematically illustrating main operations in transferring the processed cassette C3, respectively, The processed cassette C3 to which the processed wafers W have been returned in step S15 checks the operating state of the OHT. When the OHT is not transferring another cassette C and is in an empty state (a receivable state), the OHT directly accesses the cassette placement plate 14r on which the processed cassette C3 is placed, and receives the processed cassette C3 (step S21 in FIGS. 12 and 13). At this time, when the first transfer part 110 exists on a movement track from the cassette placement plate 14r to the OHT (on a delivery path), the first transfer part 110 moves along the transfer path R1 in the Y-axis direction and is retreated from the movement track so as not to obstruct the unloading of the processed cassette C3.

Meanwhile, for example, when the OHT is not empty (when the OHT is not in the receivable state), namely when the OHT is transferring another cassette C, the processed cassette C3 is temporarily stocked in the cassette holder 130. In this case, first, the processed cassette C3 is delivered from the cassette placement plate 14r onto the arm 112 of the first transfer part 110 (step S22 in FIGS. 12 and 13), and is placed on the cassette holding table 131 of the cassette holder 130 via the second transfer part 120 (step S23 in FIGS. 12 and 13).

At this time, since the empty cassette C2 is preferentially transferred to the overlapping area T in step S14 as described above, both of the two first transfer parts 110 are accessible to the processed cassette C3 to be unloaded. This makes it possible to efficiently unload the processed cassette C3 from the cassette holder 130.

Thereafter, when the OHT terminates the transfer operation of another cassette C and becomes empty (when the OHT is in the receivable state), the processed cassette C3 temporarily stocked on the cassette holding table 131 is delivered to the first transfer part 110 via the second transfer part 120 (step S24 in FIGS. 12 and 13). Then, the processed cassette C3 placed on the first transfer part 110 is delivered to the OHT (step S25 in FIGS. 12 and 13). Thereafter, the processed cassette C3 delivered to the OHT in step S21 or step S25 is unloaded outward of the wafer processing apparatus 1 (step S26 in FIGS. 12 and 13). In this way, a series of cassette loading/unloading operations is terminated.

According to the above-described embodiment, the FEX that has been provided on the front surface of the conventional wafer processing apparatus is installed on the uppermost portion of the wafer processing apparatus 1. Thus, it is possible to reduce the footprint of the FEX in the wafer processing apparatus 1. Specifically, it is possible to eliminate the footprint of the FEX itself.

In the present embodiment, the FEX 100 is provided in the uppermost portion of the wafer processing apparatus 1 without being suspended from, for example, a ceiling surface of a clean room in which the wafer processing apparatus 1 is provided. Thus, it is possible to install the FEX 100 without being affected by an external equipment or surrounding environment of the wafer processing apparatus 1. Accordingly, a so-called retrofit is possible. Similarly, it is possible to prevent the FEX 100 from interfering with the transfer track of the cassette C transferred by the OHT.

In addition, according to the present embodiment, although the FEX 100 have been described to be provided on the uppermost portion of the wafer processing apparatus 1, an enclosure formed by extending a sidewall surface of the wafer processing apparatus 1 upward may be provided around the FEX 100. With this configuration, it is possible to prevent the cassette C from dropping from the upper portion of the wafer processing apparatus 1 due to, for example, a failure of the first transfer part 110, the second transfer part 120, the cassette holder 130, or the like.

In addition, according to the above-described embodiment, it is determined whether to directly deliver the cassette C between the cassette placement plate 14 and the OHT, or whether to deliver the cassette via the FEX 100 firstly, from a cassette placement situation of the cassette placement plates 14 and a cassette holding situation of the OHT. Thus, it is possible to eliminate or minimize a waiting time for transferring the cassette C. This improves the throughput of the wafer processing apparatus 1. Such a determination is made in the controller 200.

In the embodiment described above, the total number of the first transfer parts 110 and the second transfer parts 120 serving as the transfer devices for cassettes C is four. In a conventional FEX, a single transfer means is provided to transfer cassettes C. In addition, such a transfer means is not designed to be selectively used depending on an installation area of the cassette placement plate to which the cassette C is transferred in the wafer processing apparatus 1. In this regard, according to the present embodiment, since the plurality of transfer devices are provided, it is possible to eliminate or minimize the transfer waiting time for transferring cassettes C. In particular, for example, by sharing the role of the transfer devices in the side of the sender area and the side of the receiver area, it is possible to appropriately transfer the cassettes C, thus improving the throughput of the wafer processing apparatus 1.

In the present embodiment, as described above, the number of first transfer parts 110 and the number of second transfer parts 120 are two, respectively, but is not limited thereto. For example, the number of first transfer parts 110 and the number of second transfer parts may be three or more, respectively. In some embodiments, one first transfer part and one second transfer part may be provided. In addition, the number of first transfer parts 110 and the number of second transfer parts 120 may not be the same.

In the present embodiment, one first transfer part 110 and one second transfer part 120 are provided at the side of the sender area and the side of the receiver area, respectively. However, a transfer device having the functions of both the first transfer part 110 and the second transfer part 120 may be provided. That is to say, a single transfer device (e.g., the first transfer part 110) may be configured to deliver the cassette C between the OHT, the cassette placement plate 14, and the cassette holder 130, instead of separately providing the first transfer part 110 and the second transfer part 120. In this case, two transfer devices may be provided at the side of the sender area and the side of the receiver area, respectively.

In some embodiments, in the FEX 100 in which the first transfer parts 110 corresponding to the side of the sender area and the side of the receiver area deliver the cassettes C via the second transfer part 120, when the cassette C is transferred to the central cassette holder 130, the second transfer part 120 may be configured to preferentially transfer the empty cassette C in which the wafers W are not accommodated, to the central cassette holder 130. For example, the following effects are obtained by preferentially transferring the empty cassette C in which the wafers W are not accommodated, to the central cassette holder 130.

That is to say, for example, in the case in which the cassette C accommodating the unprocessed wafers W is set to be transferred to the side of the sender area and the cassette C accommodating the processed wafers W is set to be transferred to the side of the receiver area, by preferentially transferring the empty cassette C to the central cassette holder 130, it is possible to avoid the empty cassette C from occupying the sender area and the receiver area as much as possible. This makes it possible to simplify the operations at the time of loading/unloading the cassettes C accommodating the wafers W. Even in consideration of the case of delivering the empty cassette C between the side of the sender area and the side of the receiver area in various situations, the empty cassette C may be set to be transferred to a place where the delivery of the empty cassette C between the sides is possible (that is to say, the central cassette holder 130). This broadens the versatility and increase the degree of freedom of the transfer procedure.

In any case, in order to minimize a transfer distance, the cassette C accommodating the unprocessed wafers W is set to be transferred to the side of the sender area and the cassette C accommodating the processed wafers W is set to be transferred to the side of the receiver area in principle.

However, in an irregular case, for example, when the wafers W in the wafer processing apparatus 1 need to be recovered quickly, the empty cassette C may be configured to be delivered between the side of the sender area and the side of the receiver area via the OHT such that the empty cassette C can be placed anywhere in the cassette holder 130.

In addition, the total of nine cassette holding tables 131 (three for each cassette holder 130) are provided in the above-described embodiment, but the number of cassette holding tables 131 is not limited thereto. For example, when the processing station 20 is not provided with the FFU 21, the cassette holders 130 may extend to the positive side in the X-axis direction in the upper portion of the processing station 20. Even when the processing station 20 is provided with the FFU 21, the cassette holders 130 may be provided above the FFU 21 in the vertical direction while extending above the FFU 21.

According to the above-described embodiment, three cassette holders 130 are arranged side by side in the Y-axis direction across the transfer path R2, but the number of cassette holders 130 is not limited thereto as long as the cassettes C can be appropriately transferred and delivered with respect to all the cassette holders 130.

According to the present embodiment, the cassette C placed on the first transfer part 110 is moved upward and downward between the first transfer part 110 and the cassette placement plate 14 by winding up and winding down the winding member 115 of the lifting mechanism 114 provided in the first transfer part 110. However, the configuration of the lifting mechanism 114 is not limited thereto. For example, the winding member 115 may be provided inside a lifting part (not illustrated) provided independently of the main body 111, and the elevating part may be configured to protrude upward of the cassette placement plate 14.

The lifting mechanism 114 may be configured to perform the lifting operation using, for example, a cylinder or an actuator.

Furthermore, the lifting mechanism 114 may be configured to perform the lifting operation in the state of sandwiching the cassette C from the both sides thereof as in the configuration illustrated in the OTH of FIG. 2, rather than to perform the lifting operation in the state of holding the cassette C on the upper surface of the arm 112 provided to protrude from the main body 111.

The arm 112 of the first transfer part 110 may be configured to be extendible, for example, in the horizontal direction, specifically in the X-axis direction of FIG. 1. As described above, by configuring the arm 112 to be extendible in the X-axis direction, for example, even when a distance and positional relationship between the transfer path R0 fixedly installed in the clean room and the cassette placement plate 14 are changed due to some factors, the arm 112 is capable of appropriately delivering the cassette with respect to the OHT. In the case in which the distance between the transfer path R0 and the cassette placement plate 14 changes in the Y-axis direction, it is possible to appropriately deliver the cassette by moving the arm 112 along the transfer path R1 in the Y-axis direction.

<Modification of First Transfer Part>

Figure 14:
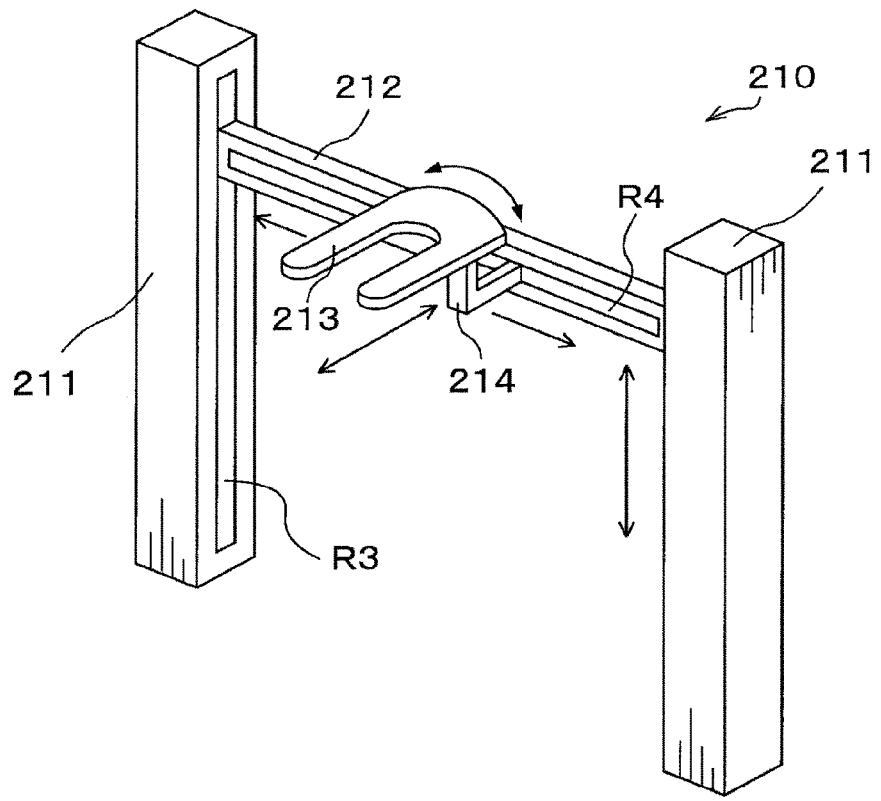
FIG. 14 is a perspective view schematically illustrating the outline of a modification of the first transfer part.

Next, a modification of the first transfer part 110 will be described with reference to the drawing. FIG. 14 is a perspective view schematically illustrating the configuration of a first transfer part 210 as the modification of the first transfer part 110.

As illustrated in FIG. 14, the first transfer part 210 is configured in a gate shape and includes two support columns 211 and a beam 212. The support columns 211 have transfer paths R3 provided in inner surfaces facing each other, respectively. The beam 212 is configured to be movable upward and downward along the transfer paths R3. The beam 212 is provided with an arm 213 configured to be movable along a transfer path R4 formed in a side surface of the beam 212 while being connected to an arm support portion 214. With this configuration, the first transfer part 210 is configured to move a cassette C placed on the arm 213 in the horizontal and vertical directions along the transfer paths R3 and the transfer path R4. Thus, the first transfer part 210 is capable of delivering the cassette C with respect to a certain cassette placement plate 14.

Figure 15:
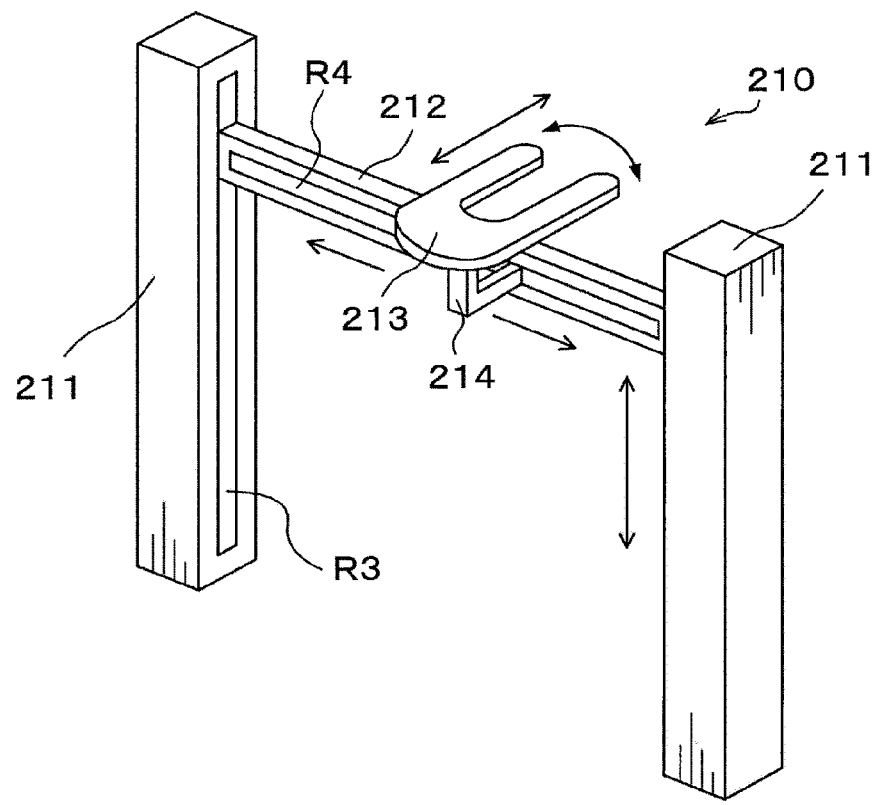
FIG. 15 is a perspective view schematically illustrating the operation of the modification of the first transfer part of FIG. 14.

The arm 213 is configured such that a lower surface thereof is higher than an upper surface of the beam 212. The arm 213 may include a rotation mechanism (not illustrated) and an extension/contraction mechanism (not illustrated), and is configured to be rotatable about a vertical axis and to be extendible in the horizontal direction as shown in FIG. 15. With this configuration, the arm 213 is capable of appropriately delivering the cassette C placed on the arm 213 between the second transfer part 120 and the cassette holding table 131 in the vicinity thereof. In addition, the first transfer part 210 configured as above may be provided at each side of the loading/unloading station 10 in the wafer processing apparatus 1.

It should be noted that the embodiments and modifications disclosed herein are exemplary in all respects and are not restrictive. The above-described embodiments may be omitted, replaced or modified in various forms without departing from the scope and spirit of the appended claims.

For example, the FEX (storage part) according to the present disclosure may not be provided directly on the upper surface of the ceiling of the wafer processing apparatus. As an example, a panel material may be provided on the upper surface of the ceiling via a support member. The first transfer parts, the second transfer parts, the cassette holders, the transfer paths and the like may be installed on an upper surface of the panel material. In this case, the upper surface of the panel material becomes the uppermost portion. With this configuration, the technique according to the present disclosure is easily applicable to an existing wafer processing apparatus by installing the panel material on the upper portion of the existing wafer processing apparatus.

In addition, with the FEX (storage part) according to the present disclosure, the lifting mechanism configured to move the cassette upward and downward between the uppermost portion of the wafer processing apparatus and the cassette placement table is provided in the first transfer part. Thus, it is possible to apply the FEX to the existing wafer processing apparatus.

The following configurations also belong to the technical scope of the present disclosure.

A substrate processing apparatus for processing a substrate, includes: a storage part provided on an uppermost portion of the substrate processing apparatus and on which a substrate accommodation container for accommodating the substrate is placed; and a first transfer device configured to directly or indirectly deliver the substrate accommodation container between the storage part and a loading/unloading part, wherein the loading/unloading part is configured to place the substrate accommodation container thereon in the substrate processing apparatus and to load and unload the substrate into and from a processing part of the substrate processing apparatus, wherein the first transfer device is configured to deliver the substrate accommodation container with respect to an overhead hoist transport that moves above the substrate processing apparatus.

Further, in an embodiment of the present disclosure, the substrate processing apparatus includes a first controller configured to control an operation of the first transfer device. Wherein, when the overhead hoist transport directly delivers the substrate accommodation container to the loading/unloading part along a delivery path, the first controller controls the first transfer device to be retreated from the delivery path so as not to obstruct the direct delivery.

Further, in an embodiment of the present disclosure, the loading/unloading part includes a loading-dedicated section and an unloading-dedicated section. The first transfer device includes a plurality of transfer devices which are provided to correspond to the loading-dedicated section and the unloading-dedicated section, respectively.

Further, in an embodiment of the present disclosure, the substrate processing apparatus further includes a first controller configured to control an operation of the first transfer device. The first controller is configured to independently control the operation of each of the plurality of transfer devices provided to correspond to the loading-dedicated section and the unloading-dedicated section, respectively.

Further, in an embodiment of the present disclosure, the substrate processing apparatus further includes a second transfer device configured to deliver the substrate accommodation container between the storage part and the first transfer device.

The second transfer device may include a plurality of transfer devices.

Further, in an embodiment of the present disclosure, the substrate processing apparatus further includes a second controller configured to control an operation of the second transfer device. The second controller is configured to control the second transfer device to transfer an empty substrate accommodation container in which no substrate is accommodated to an area in the storage part to which a plurality of first transfer devices provided to correspond to a loading-dedicated section and an unloading-dedicated section are capable of delivering the substrate accommodation container via the second transfer device, the plurality of first transfer devices being included in the first transfer device.

Further, in an embodiment of the present disclosure, the first transfer device is movable in a horizontal direction. Here, the horizontal direction may be any of the X-axis direction and the Y-axis direction. In addition, the first transfer device may be movable in both the X-axis direction and the Y-axis direction.

Further, in an embodiment of the present disclosure, there is provided a method of processing a substrate using a substrate processing apparatus. The substrate processing apparatus includes: a storage part provided on an uppermost portion of the substrate processing apparatus and on which a substrate accommodation container for accommodating the substrate is placed; a first transfer device configured to deliver the substrate accommodation container between the storage part and a loading/unloading part, the loading/unloading part configured to place the substrate accommodation container thereon in the substrate processing apparatus and to load and unload the substrate into and from a processing part of the substrate processing apparatus; and a second transfer device configured to deliver the substrate accommodation container between the storage part and the first transfer device, wherein the first transfer device is configured to deliver the substrate accommodation container with respect to an overhead hoist transport that moves above the substrate processing apparatus. The method includes, when the overhead hoist transport directly delivers the substrate accommodation container to the loading/unloading part along a delivery path, retreating the first transfer device from the delivery path so as not to obstruct the direct delivery.

Further, in an embodiment of the present disclosure, the first transfer device in the substrate processing apparatus includes a plurality of first transfer devices, and the second transfer device in the substrate processing apparatus includes a plurality of second transfer devices. The substrate accommodation container is delivered by one of the plurality of first transfer devices and one of the plurality of second transfer devices corresponding to the one of the plurality of first transfer devices.

Further, in an embodiment of the present disclosure, the loading/unloading part in the substrate processing apparatus includes a loading-dedicated section and an unloading-dedicated section, and the plurality of first transfer devices are provided to correspond to the loading-dedicated section and the unloading-dedicated section. The substrate accommodation container includes an unprocessed substrate accommodation container configured to accommodate an unprocessed substrate, a processed substrate accommodation container configured to accommodate a processed substrate or an empty substrate accommodation container in which no substrate is accommodated, the unprocessed substrate accommodation container being placed on the loading-dedicated section, the processed substrate accommodation container or the empty substrate accommodation container are placed on the unloading-dedicated section. The plurality of first transfer devices deliver the unprocessed substrate accommodation container placed on the loading-dedicated section, the processed substrate accommodation container or the empty substrate accommodation container placed on the unloading-dedicated section, respectively.

Further, in an embodiment of the present disclosure, the method further includes moving, by the second transfer device, the empty substrate accommodation container to an area in the storage part to which all the plurality of first transfer devices provided to correspond to the loading-dedicated section and the unloading-dedicated section are capable of delivering the substrate accommodation container.

According to the present disclosure, it is possible to reduce a footprint occupied by a storage part in which a substrate processing container for accommodating substrates is temporarily put on standby.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus for processing a substrate, comprising:
   a storage part installed on an upper surface of an uppermost portion of the substrate processing apparatus and on which a substrate accommodation container for accommodating the substrate is placed; and
   a first transfer device configured to directly or indirectly deliver the substrate accommodation container between the storage part and a loading/unloading part and to the upper surface of the uppermost portion of the substrate processing apparatus,
   wherein the loading/unloading part is configured to place the substrate accommodation container thereon in the substrate processing apparatus and to load and unload the substrate into and from a processing part of the substrate processing apparatus,
   wherein the first transfer device is configured to deliver the substrate accommodation container with respect to an overhead hoist transport that moves above the substrate processing apparatus,
   wherein the loading/unloading part comprises a loading-dedicated section and an unloading-dedicated section, and
   wherein the first transfer device includes a plurality of transfer devices which are provided to correspond to the loading-dedicated section and the unloading-dedicated section, respectively.

2. The substrate processing apparatus of claim 1, further comprising:
   a first controller configured to control an operation of the first transfer device,
   wherein the first controller is configured to independently control the operation of each of the plurality of transfer devices provided to correspond to the loading-dedicated section and the unloading-dedicated section, respectively.

3. The substrate processing apparatus of claim 1, further comprising:
   a second transfer device configured to deliver the substrate accommodation container between the storage part and the first transfer device.

4. The substrate processing apparatus of claim 3, further comprising:
   a second controller configured to control an operation of the second transfer device,
   wherein the second controller is configured to control the second transfer device to transfer an empty substrate accommodation container in which no substrate is accommodated to an area in the storage part to which the plurality of first transfer devices provided to correspond to the loading-dedicated section and the unloading-dedicated section are capable of delivering the substrate accommodation container via the second transfer device, the plurality of first transfer devices being included in the first transfer device.

5. The substrate processing apparatus of claim 1, wherein the substrate accommodation container is provided in plural, and
   the storage part is configured to place the substrate accommodation containers thereon in a state where the substrate accommodation containers are arranged step by step in a range including an upper surface of the loading/unloading part and the upper surface of the uppermost portion of the processing part.

6. A method of processing a substrate using a substrate processing apparatus,
   wherein the substrate processing apparatus comprises:
   a storage part provided on an uppermost portion of the substrate processing apparatus and on which a substrate accommodation container for accommodating the substrate is placed;
   a first transfer device configured to deliver the substrate accommodation container between the storage part and a loading/unloading part, the loading/unloading part configured to place the substrate accommodation container thereon in the substrate processing apparatus and to load and unload the substrate into and from a processing part of the substrate processing apparatus; and
   a second transfer device configured to deliver the substrate accommodation container between the storage part and the first transfer device,
   wherein the first transfer device is configured to deliver the substrate accommodation container with respect to an overhead hoist transport that moves above the substrate processing apparatus, the method comprising:

when the overhead hoist transport directly delivers the substrate accommodation container to the loading/unloading part along a delivery path, retreating the first transfer device from the delivery path so as not to obstruct the direct delivery.

7. The method of claim 6, wherein the first transfer device in the substrate processing apparatus includes a plurality of first transfer devices, and the second transfer device in the substrate processing apparatus includes a plurality of second transfer devices, wherein the substrate accommodation container is delivered by one of the plurality of first transfer devices and one of the plurality of second transfer devices corresponding to the one of the plurality of first transfer devices.

8. The method of claim 7, wherein the loading/unloading part in the substrate processing apparatus includes a loading-dedicated section and an unloading-dedicated section, and the plurality of first transfer devices are provided to correspond to the loading-dedicated section and the unloading-dedicated section, wherein the substrate accommodation container includes an unprocessed substrate accommodation container configured to accommodate an unprocessed substrate, a processed substrate accommodation container configured to accommodate a processed substrate or an empty substrate accommodation container in which no substrate is accommodated, the unprocessed substrate accommodation container being placed on the loading-dedicated section, the processed substrate accommodation container or the empty substrate accommodation container are placed on the unloading-dedicated section, and wherein the plurality of first transfer devices deliver the unprocessed substrate accommodation container placed on the loading-dedicated section, the processed substrate accommodation container or the empty substrate accommodation container placed on the unloading-dedicated section, respectively.

9. The method of claim 8, further comprising: moving, by the second transfer device, the empty substrate accommodation container to an area in the storage part to which all the plurality of first transfer devices provided to correspond to the loading-dedicated section and the unloading-dedicated section are capable of delivering the substrate accommodation container.

10. A substrate processing apparatus for processing a substrate, comprising:

a storage part provided on an uppermost portion of the substrate processing apparatus and on which a substrate accommodation container for accommodating the substrate is placed;

a first transfer device configured to directly or indirectly deliver the substrate accommodation container between the storage part and a loading/unloading part; and a first controller configured to control an operation of the first transfer device, wherein the loading/unloading part is configured to place the substrate accommodation container thereon in the substrate processing apparatus and to load and unload the substrate into and from a processing part of the substrate processing apparatus, wherein the first transfer device is configured to deliver the substrate accommodation container with respect to an overhead hoist transport that moves above the substrate processing apparatus, and wherein, when the overhead hoist transport directly delivers the substrate accommodation container to the loading/unloading part along a delivery path, the first controller controls the first transfer device to be retreated from the delivery path so as not to obstruct the direct delivery.

11. The substrate processing apparatus of claim 10, wherein the first transfer device is further configured to deliver the substrate accommodation container with respect to the overhead hoist transport on the delivery path.

12. The substrate processing apparatus of claim 10, wherein the loading/unloading part includes a plurality of cassette placement plates arranged in a horizontal direction, wherein the plurality of cassette placement plates is configured to be delivered between the substrate accommodation container and the processing part, and wherein the first transfer device is further configured to move along a horizontal transfer path extending in the horizontal direction, to deliver the substrate accommodation container while moving along the horizontal transfer path, and to be retreated from the delivery path along the horizontal transfer path.

13. The substrate processing apparatus of claim 10, wherein the loading/unloading part comprises a loading-dedicated section and an unloading-dedicated section, and wherein the first transfer device includes a plurality of transfer devices which are provided to correspond to the loading-dedicated section and the unloading-dedicated section, respectively.

14. The substrate processing apparatus of claim 13, wherein the first controller is further configured to independently control the operation of each of the plurality of transfer devices provided to correspond to the loading-dedicated section and the unloading-dedicated section, respectively.

15. The substrate processing apparatus of claim 10, further comprising:

a second transfer device configured to deliver the substrate accommodation container between the storage part and the first transfer device.

16. The substrate processing apparatus of claim 15, further comprising:

a second controller configured to control an operation of the second transfer device, wherein the second controller is configured to control the second transfer device to transfer an empty substrate accommodation container in which no substrate is accommodated to an area in the storage part to which a plurality of first transfer devices provided to correspond to a loading-dedicated section and an unloading-dedicated section are capable of delivering the substrate accommodation container via the second transfer device, the plurality of first transfer devices being included in the first transfer device.

* * * * *